United States Patent [19]
Fett et al.

[11] 3,974,402
[45] Aug. 10, 1976

[54] LOGIC LEVEL TRANSLATOR

[75] Inventors: Darrell L. Fett, Scottsdale; David A. Bird, Phoenix, both of Ariz.; Jerry L. Rauser, Crystal, Minn.

[73] Assignee: Honeywell Information Systems, Inc., Phoenix, Ariz.

[22] Filed: Mar. 26, 1975

[21] Appl. No.: 562,329

[52] U.S. Cl. ............................. 307/264; 307/203; 307/214; 307/DIG. 1
[51] Int. Cl.[2] ..................... H03K 1/14; H03K 19/08
[58] Field of Search ............... 307/214, 215, DIG. 1, 307/264, 203

[56] References Cited
UNITED STATES PATENTS 3,766,406  10/1973  Bryant et al. .................... 307/214 X

*Primary Examiner*—John Zazworsky
*Attorney, Agent, or Firm*—Walter W. Nielsen; William W. Holloway, Jr.

[57] ABSTRACT

A logic level translator utilizes a TTL logic gate, a current switch, and a clamp circuit to convert CML level binary signals into TTL level binary signals. The translator provides isolation between the TTL ground and the CML ground in order to reduce noise in the CML portion of the circuit. The clamp circuit prevents a switching transistor in the current switch from reaching saturation, thereby increasing the speed of operation of the translator. A portion of the current switch provides a quick pulldown of a switching transistor in the TTL circuit to reduce noise in the TTL circuit.

4 Claims, 2 Drawing Figures

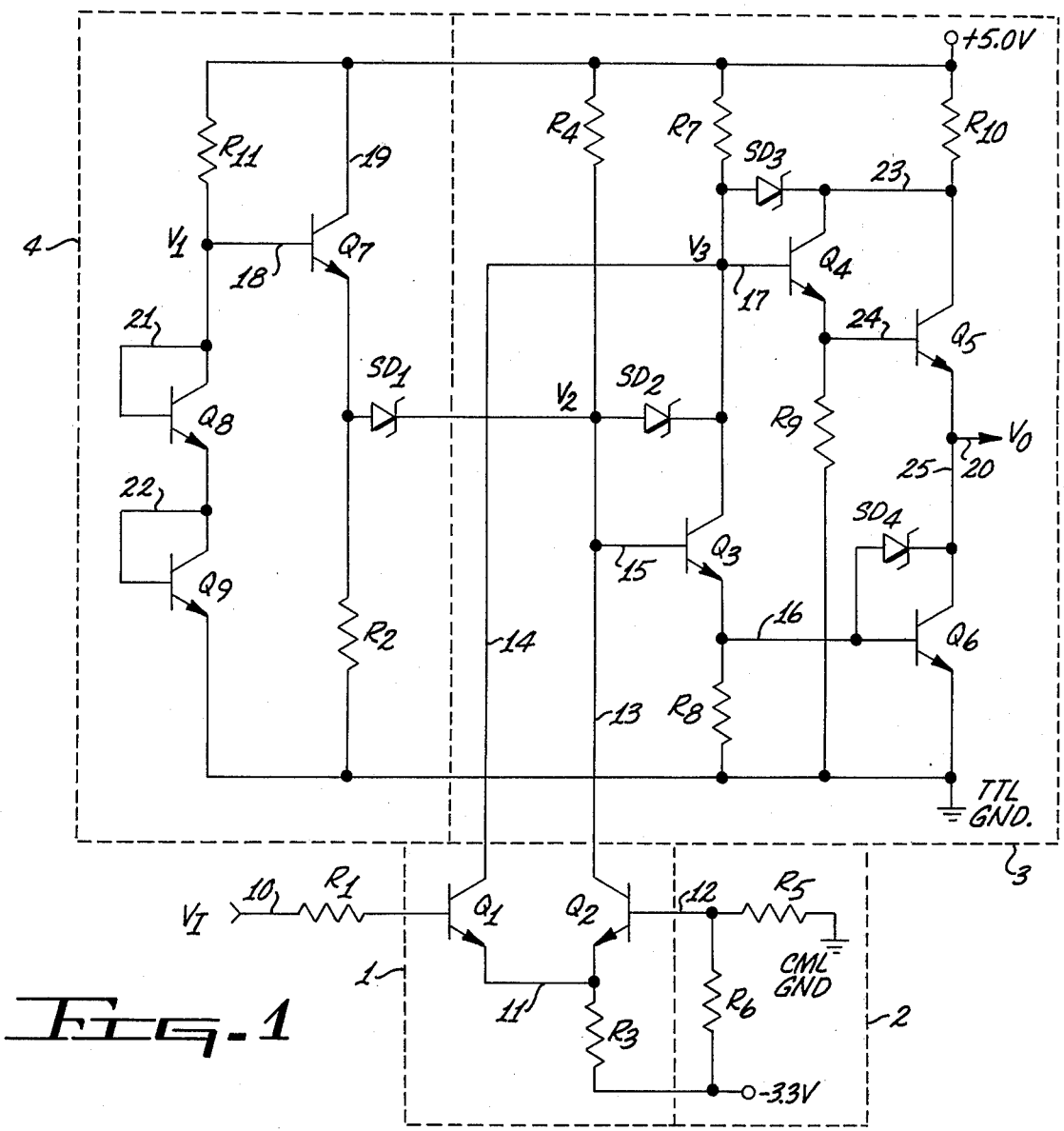
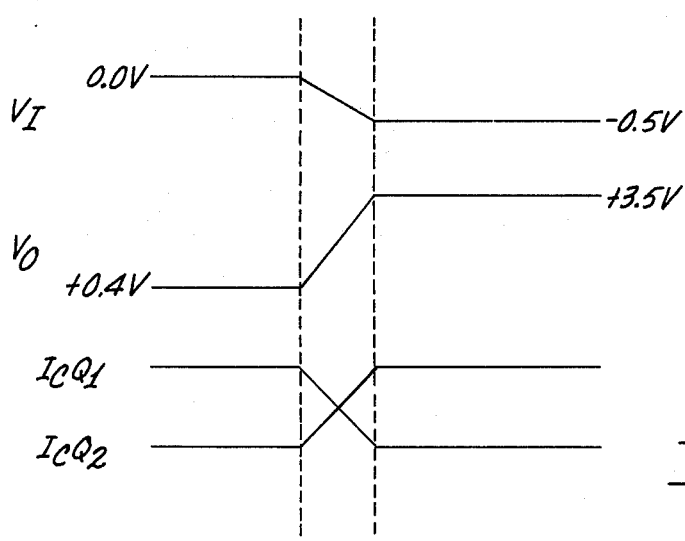

LOGIC LEVEL TRANSLATOR

BACKGROUND OF THE INVENTION

The present invention relates to logic level translators, and, more particularly, to a logic level translator which comprises a TTL logic gate, a current switch, and a clamp circuit for converting CML level binary signals into TTL level binary signals.

Current data processing systems utilize transistor-transistor logic (TTL) and current-mode logic (CML) to manipulate, store, and process data which is represented in binary form. In many of the current data processing systems different types of logic may be used in different portions of the data processing system. In order to transfer data from one portion of the processing system to another portion of the processing system it is often necessary to translate from one type of logic signal into another type of logic signal.

Prior art signal translators use diodes and other semiconductor devices to obtain a fixed voltage drop in order to translate from one type of binary signal level to another type of binary signal level. These prior art signal translators use a common ground which is shared by both the input and the output signals. For example, a CML input signal and a TTL output signal would use the same bus line as a common ground. The TTL currents occurring in the common ground bus introduce noise signals in the CML portion of the translator. Also, variations in the power supply voltage used in the TTL portion are coupled to the CML portion of the circuit. Furthermore, TTL circuits generate self-induced noise at a level which is unacceptable when such is introduced into the CML circuits. Thus, it is important that the noise developed in the prior art translators be eliminated to prevent error signals from being generated in the output of the data processing system.

It is also a desirable feature of a logic level translator to prevent saturation in any of the switching transistors thereof in order to increase the operational speed of the translator.

According to one embodiment of the invention disclosed in U.S. Ser. No. 484,513 of D. L. Fett, filed July 1, 1974, and assigned to the same assignee as the present invention, a logic level translator is provided for converting TTL and DTL level binary signals into CML and ECL level binary signals. Such invention solves certain problems involved in the conversion of TTL level binary signals into CML level binary signals but does not concern itself with the above referred to problems and concerns involved in the conversion of CML level binary signals into TTL level binary signals.

It is therefore an object of the present invention to provide improved apparatus for translating CML level binary signals into TTL level binary signals.

Another object of the invention is to provide a logic level translator which substantially reduces the noise occurring in the CML and TTL portions of the translator.

A further object of the invention is to provide a logic level translator having a relatively high speed of operation in converting CML signals into TTL signals.

Yet another object of the invention is to provide a logic level translator in which the CML ground bus is isolated from the TTL ground bus.

These and other objects of the present invention are achieved by providing a logic level translator comprising a TTL logic gate, a CML current switch including differential current sources, and a clamp circuit. The current switch comprises a first transistor for switching current into the TTL logic gate in response to the CML signal input level and a second transistor for providing a quick pull-down on a portion of the TTL logic gate in order to reduce noise in the TTL circuit. The clamp circuit prevents the first transistor of the current switch from reaching saturation, thereby increasing the effective speed of the logic level translator. Separate grounds are provided for the TTL and CML portions of the translator.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 1 shows a detailed circuit schematic of the CML-to-TTL logic level translator of the present invention.

FIG. 2 shows waveforms providing an explanation of the operation of the CML-to-TTL logic level translator shown in FIG. 1.

DESCRIPTION OF THE PREFERRED EMBODIMENT

Referring now to FIG. 1, the CML-to-TTL logic level translator comprises current switch 1, voltage divider 2, TTL logic gate 3, and clamp circuit 4. A CML level signal applied to the input terminal $V_I$ is translated into a TTL level signal at the output terminal $V_O$.

Isolation is provided between the TTL ground of the TTL logic gate and the CML ground of the CML circuitry in order to reduce the noise which may be transferred between the TTL ground bus and the CML ground bus. This results in a relatively noisefree TTL output signal $V_O$. Also by isolating the TTL and CML grounds, self-induced noise generated in the TTL circuit is prevented from affecting the operation of the CML circuit. Due to the high current transients produced within the TTL circuit and to the high inductance levels present within the integrated circuit package leads to the logic level translator, transient noise voltages are produced in the grounds and power supplies. The transient voltages in the TTL circuit would cause fluctuations in the reference voltage of the CML circuit if the CML ground were coupled to the TTL ground, resulting in a retardation or advancement in the switching operation of transistor $Q_2$, with an overall detrimental effect on the operation of the logic level translator circuit.

The basic TTL logic gate 3 comprises transistors $Q_3$, $Q_4$, $Q_5$, and $Q_6$. Each of transistors $Q_3$, $Q_4$, and $Q_6$ has a corresponding Schottky diode $SD_2$, $SD_3$, and $SD_4$, respectively, connected between the base and collector in order to prevent saturation in these transistors by reducing the storage time in them, in a manner which is well known in the art. While transistor $Q_5$ is shown without a corresponding Schottky diode, one could optionally be connected between the base and collector of transistor $Q_5$.

Current switch 1 comprises transistors $Q_1$ and $Q_2$ whose emitters are coupled to the −3.3v CML power supply by resistor $R_3$. The base of $Q_1$ is connected to the input terminal $V_I$ of the logic level translator by means of resistor $R_1$. The base of transistor $Q_2$ is at a constant reference voltage of approximately −0.26V provided by the voltage divider 2 comprising resistors $R_5$ and $R_6$ connected between the −3.3V CML power supply and the CML ground. The collector of transistor $Q_2$ is connected to the base of transistor $Q_3$ of the TTL logic gate 3 as well as to the 5.0v power supply of the TTL logic gate 3 through resistor $R_4$. The collector of transistor $Q_1$ of current switch 1 is connected to the base of transistor $Q_4$ of the TTL logic gate 3 and to the 5.0V TTL power supply through resistor $R_7$.

The switching of transistor $Q_2$ provides the presence or absence of current in the TTL logic gate 3 to effectuate the desired logic level translation at the output terminal of the TTL logic gate 3 in a manner to be further described below. Transistor $Q_1$ of current switch 1 serves primarily to control the switching operation of transistor $Q_2$, and secondarily to provide a quick pulldown of the current flowing through the base-emitter junction of transistor $Q_4$ of TTL logic gate 3, when transistor $Q_2$ is switched to its nonconductive state, in order to reduce noise in the TTL circuitry in a manner also to be described in further detail below.

Clamp circuit 4 comprises transistor $Q_7$ in an emitter-follower configuration the purpose of which is to provide a high input impedance level to the clamp circuit and a low output impedance level. Transistors $Q_8$ and $Q_9$ are each base-to-collector connected and accordingly function as forward-biased diodes, each having a voltage drop of approximately 0.8V.

The operation of the circuit shown in FIG. 1 will now be described in connection with the waveforms of FIG. 2. Regarding the CML binary input signals, a negative logic convention is employed, according to which a binary zero is represented by 0 volts and a binary one is represented by −0.5V. With respect to the TTL binary output signals, a positive logic convention is used, according to which a binary zero is represented by approximately 0.4V and a binary one is represented by a positive 3.5V.

When a CML signal of −0.5V representing a binary one is applied to the base of transistor $Q_1$, transistor $Q_1$ is rendered nonconductive due to the fact that the base-to-emitter voltage across transistor $Q_1$ decreases to a value below the threshold voltage. Transistor $Q_2$ is rendered conductive, providing a current path from the 5.0V TTL power supply through resistor R4, through the collector-to-emitter junction of transistor $Q_2$, through resistor $R_3$ to the −3.3V power supply of the CML circuit.

The potential at the base of transistor $Q_3$ drops to no lower than 0.3V. The 0.3V applied to the base of transistor $Q_3$ is provided by the clamp circuit 4. The potential at point $V_1$ of clamp circuit 4 is a virtually constant 1.6V independent of variations in current through clamp circuit 4. The drop between point $V_1$ and the TTL ground consists of a 0.8V drop across the collector-to-emitter junction of transistor $Q_8$ and a 0.8V drop across the collector-to-emitter junction of transistor $Q_9$. A corresponding 1.6V drop between point $V_1$ and the TTL ground occurs. As a result of the 0.8V drop across the base-to-emitter junction of transistor $Q_7$ and the 0.5V drop across forward-biased Schottky diode $SD_2$, a voltage of approximately 0.3V results at the base of transistor $Q_3$.

The N-P-N transistors of the circuit shown in FIG. 1 become conductive when the forward-biased base-to-emitter potential reaches approximately 0.8V. Thus transistor Q3 is nonconductive with only a 0.3V base-to-emitter potential difference, and there is zero potential at the base of transistor $Q_6$, so that it too is not conductive. The potential at point $V_3$ rises, turning on transistor $Q_4$, thereby providing a current path from the 5.0V power supply of the TTL logic gate 3 through resistor $R_7$, through Schottky diode $SD_3$, across the collector-to-emitter junction of transistor $Q_4$, through resistor $R_9$ to the TTL ground. The potential on the base of transistor $Q_5$ rises, turning on transistor $Q_5$, and the output voltage at output terminal $V_O$ rises to approximately 3.5V representing a binary one.

Clamp circuit 4 limits the lower voltage level at point $V_2$ to 0.3V. As a result, transistor $Q_2$ is prevented from reaching saturation as a result of negative-going fluctuations on line 13 caused by variations in the TTL power supply or noise between the TTL and CML grounds. By preventing transistor $Q_2$ from reaching saturation, such transistor is assured of having a fast switch-off time, thereby increasing the speed of operation of the logic level translator circuit. The clamp circuit also functions to reduce the effect of the parasitic capacitance between the emitter and base of transistor $Q_2$, since the current through such junction is limited by the narrow voltage swing at point $V_2$ between 0.3V and 1.6V. Thus by reducing the voltage swing across the emitter-base junction of transistor $Q_2$, the operational switching frequency of transistor $Q_2$ is increased.

When a zero voltage representing a binary zero is applied to input terminal $V_I$ and over input line 10 to the base of transistor $Q_1$, transistor $Q_1$ is rendered conductive and transistor $Q_2$ is rendered nonconductive. With transistor $Q_2$ off, transistor $Q_3$ conducts current across its collector-emitter junction through resistor $R_8$ to the TTL ground when the base voltage of transistor $Q_3$ reaches approximately 0.8V. Because of the current flow from the 5.0V power supply of the TTL logic gate 3 through resistor $R_7$ across the collector-to-emitter junction of transistor $Q_3$ through resistor $R_8$ to the TTL ground, the potential at point $V_3$ drops, and transistor $Q_4$ is rendered nonconductive. With reference to transistor $Q_6$, when the base of transistor $Q_3$ reaches approximately 1.6V, the base voltage of transistor $Q_6$ is approximately 0.8V, and transistor $Q_6$ becomes conductive. Due to the 0.4V drop across Schottky diode SD4, the actual output voltage $V_O$ is 0.8V minus 0.4V, or about 0.4V representing a binary 0.

The function of transistor $Q_1$ of current switch 1 will now be described with regard to its operation in eliminating noise in the TTL logic gate 3. It will be noted that under the input condition when transistor $Q_1$ becomes conductive, transistor $Q_3$ serves the dual function of switching off transistor $Q_4$ at the same time that it switches on transistor $Q_6$. If the potential at point $V_3$ on the base of transistor $Q_4$ remains high for too long after transistor $Q_1$ has become conductive, transistor $Q_5$ will also remain on to conduct a heavy current surge from the TTL power supply through transistor $Q_6$, which has just been turned on, to the TTL ground. The relationship between the collector current $I_cQ_1$ in transistor $Q_1$ and the collector current $I_cQ_2$ in transistor $Q_2$ is shown in the lower portion of FIG. 2, from which one may observe that as the collector current in one transistor rises, the collector current in the other transistor falls, and vice versa. Transistor $Q_1$, when turned on, serves to provide a quick drop between point $V_3$ and the −3.3V CML power supply. By quickly lowering the potential at the base of transistor $Q_4$, transistor $Q_5$ is rendered nonconductive prior to the time that transistor $Q_6$ is rendered conductive, thereby substantially eliminating the aforementioned current surge through transistors $Q_5$ and $Q_6$.

It will be apparent to those skilled in the art that the disclosed Logic Level Translator circuit may be modified in numerous ways and may assume many embodiments other than the preferred form specifically set out and described above. For example, resistor $R_{10}$ may be eliminated from the circuit, since its only function is to prevent excessive current flow in the event of an accidental short between the TTL power supply and ground; $R_1$ may also be eliminated from the circuit. In addition, the connections of lines 13 and 14 may be reversed, so that line 13 would be connected to line segment 17 and line 14 would be connected to line segment 15, the functions of transistors $Q_1$ and $Q_2$ would be reversed, and the output $V_o$ would be inverted from that shown in FIG. 2. Furthermore, each of transistors $Q_3$, $Q_4$, and $Q_6$, together with their associated Schottky diodes, $SD_2$, $SD_3$, and $SD_4$, respectively, may be replaced by Schottky transistors. Furthermore, the collector of transistor $Q_1$ could be connected to the emitter, rather than the base, of transistor $Q_4$. Also, voltage divider 2 may be replaced by an alternative means for supplying the −0.26v reference voltage to the base of transistor$Q_2$. Accordingly, it is intended by the appended claims to cover all modifications of the invention which fall within the true spirit and scope of the invention.

What is claimed is:

1. Apparatus in a logic level translator, translating signals from a first logic level to a second logic level, for reducing the effect of noise in said translator and increasing the operational speed of said translator, said apparatus comprising:
    a TTL logic gate having an input lead, an output terminal transmitting signals at a second logic level, and a first ground potential;
    a CML current switch having an input terminal receiving signals at a first logic level, said switch being connected to a second ground potential, said second ground potential being electrically isolated from said first ground potential, said switch comprising switching means connected to said input lead of said TTL logic gate, said switching means being responsive to a first logic level signal in a first condition for causing said TTL logic gate to transmit a second logic level signal in a first condition, and said switching means further being responsive to a first logic level signal in a second condition for causing said TTL logic gate to transmit a second logic level signal in a second condition; and
    a clamp circuit connected to said current switch for limiting the current flow through said switching means to a predetermined value.

2. The apparatus according to claim 1 in which said switching means of said current switch comprises a transistor.

3. A logic level translator for translating signals from a first logic level to a second logic level, said translator comprising:
    a TTL logic gate having an input lead, an output terminal transmitting signals at a second logic level, a first reference potential, and a first ground potential;
    a CML current switch having an input terminal receiving signals at a first logic level, first and second transistors, a second reference potential, and a second ground potential, said second ground potential being electrically isolated from said first ground potential, the base of said first transistor being connected to said input terminal and the emitter of said first transistor being connected to the emitter of said second transistor, the base of said second transistor being connected to said second reference potential and the collector of said second transistor being connected to the input lead of said TTL logic gate; and
    a clamp circuit connected to said first reference potential and to the collector of said second transistor of said current switch for preventing said second transistor from reaching saturation.

4. Apparatus in a logic level translator, translating signals from a first logic level to a second logic level, for reducing the effect of noise in said translator and increasing the operational speed of said translator, said apparatus comprising:
    a TTL logic gate having an input lead, an output terminal transmitting signals at a second logic level, a first reference potential, a first ground potential, a first transistor having its emitter connected to said output terminal and its collector connected to said first reference potential, a second transistor having its emitter connected to the base of said first transistor and its base and collector connected to said first reference potential, and a third transistor having its collector connected to said output terminal and its emitter connected to said first ground potential;
    a CML current switch having an input terminal receiving signals at a first logic level, a second reference potential, and a second ground potential, a fourth transistor responsive to a first logic level signal in a first condition for assuming a conductive state to cause said first and second transistors of said TTL logic gate to become conductive, to cause said third transistor of said TTL logic gate to become nonconductive, and to cause said output terminal to transmit a second logic level signal in a first condition, said fourth transistor further being responsive to a first logic level signal in a second condition for assuming a nonconductive state to cause said first and second transistors of said TTL logic gate to become nonconductive, to cause said third transistor of said TTL logic gate to become conductive, and to cause said output terminal to transmit a second logic level signal in a second condition, a fifth transistor having its emitter connected to said second reference potential, its collector connected to the base of said second transistor of said TTL logic gate, and its base connected to said input terminal, said fifth transistor being conductive when said fourth transistor is nonconductive and said fifth transistor being nonconductive when said forth transistor is conductive; and
    a clamp circuit connected to said first reference potential and to the collector of said fourth transistor of said current switch for preventing said fourth transistor from reaching saturation when it is conductive;
    whereby when said fourth transistor of said current switch switches from said conductive state to said nonconductive state and said fifth transistor of said current switch becomes conductive, said first and second transistors of said TTL logic gate are rendered nonconductive preventing excessive current flow through said second and third transistors of said TTL logic gate between said first reference potential and said first ground potential.

* * * * *